US008053369B2

(12) United States Patent
Takase

(10) Patent No.: US 8,053,369 B2
(45) Date of Patent: Nov. 8, 2011

(54) PROCESS FOR FORMING OPENING PORTION IN INTERLAYER INSULATION FILM ON METALLIC LAYER OF SEMICONDUCTOR DEVICE

(75) Inventor: Akihiro Takase, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 12/613,276

(22) Filed: Nov. 5, 2009

(65) Prior Publication Data

US 2010/0112813 A1 May 6, 2010

(30) Foreign Application Priority Data

Nov. 6, 2008 (JP) .................................. 2008-285373

(51) Int. Cl.
*H01L 21/311* (2006.01)
*H01L 23/48* (2006.01)
(52) U.S. Cl. ......... 438/700; 438/694; 438/637; 257/758
(58) Field of Classification Search .................. None
See application file for complete search history.

(56) References Cited

U.S. PATENT DOCUMENTS

| 6,551,399 | B1 * | 4/2003 | Sneh et al. ............... 117/102 |
| 2007/0093060 | A1 * | 4/2007 | Tonegawa .................... 438/687 |
| 2007/0232075 | A1 * | 10/2007 | Imada et al. ............... 438/758 |
| 2008/0001699 | A1 * | 1/2008 | Gardner et al. ............. 336/200 |
| 2008/0169534 | A1 * | 7/2008 | Dip et al. .................... 257/622 |
| 2009/0014879 | A1 * | 1/2009 | Park et al. ................... 257/751 |

FOREIGN PATENT DOCUMENTS

| JP | 2004-356474 | 12/2004 |
| JP | 2006-165189 | 6/2006 |

* cited by examiner

*Primary Examiner* — N Drew Richards
*Assistant Examiner* — Peter Bradford
(74) *Attorney, Agent, or Firm* — Finnegan, Henderson, Farabow, Garrett & Dunner, L.L.P.

(57) ABSTRACT

A manufacturing method for a semiconductor device, including: forming a metallic layer and an interlayer insulation film on a semiconductor substrate sequentially; etching on the interlayer insulation film using fluorine-based etching gas to form an opening portion of a predetermined pattern, reaching the metallic layer; and supplying chlorine-based silane gas and discharging, thus forming a Si film at least on an internal surface of the opening portion without exposure to the atmosphere after the etching.

17 Claims, 4 Drawing Sheets

PROCESS FOR FORMING OPENING PORTION IN INTERLAYER INSULATION FILM ON METALLIC LAYER OF SEMICONDUCTOR DEVICE

CROSS-REFERENCE TO RELATED APPLICATION

This application is based upon and claims the benefit of priority from the prior Japanese Patent Application No. 2008-285373 filed on Nov. 6, 2008, the entire contents of which are incorporated herein by reference.

BACKGROUND OF THE INVENTION

The present invention relates to a manufacturing method for a semiconductor device, for example, having a copper wiring and a low-dielectric constant interlayer insulation film.

In recent years, a copper wiring has been used with miniaturization and high-speed operation of a semi conductor device. Further, in order to reduce a wiring interval and to inhibit a delay of an electrical circuit signal due to multiple layering, an interlayer insulation film with a low dielectric constant has been used. As the interlayer insulation film having a low dielectric constant, for example, SiCOH film including $CH_3$ or H bonded to a $SiO_2$ framework has been used.

In such a semiconductor device of a multiple-layered structure using a copper wiring and an interlayer insulation film with a low dielectric constant, a diffusion prevention film having high barrier properties is formed on an interface between a lower-layer copper wiring and the interlayer insulation film in order to prevent copper contained in a lower-layer copper wiring from being diffused into the interlayer insulation film. Such a diffusion prevention film is exposed at a via hole pattern bottom portion when a via hole pattern is formed on the interlayer insulation film. After formation of a wiring groove, the exposed portion of the diffusion prevention film is removed by etching. In this case, a film including Si such as SiN, SiCN or SiC is used as the diffusion prevention film and therefore dry etching using fluorine-based etching gas is commonly performed.

Such etching causes a copper wiring to be exposed at a via hole bottom portion and to be left in the atmosphere in this state until the next process. However, in this state, the copper wiring is corroded as described in Japanese Patent Application Laid-Open No. 2004-356474 (paragraph [0010], etc.).

More specifically, for example, it can be described as follows: Due to dry etching using fluorine-based etching gas, fluorine remains on the exposed copper wiring surface. The remaining fluorine reacts with moisture in the atmosphere and is converted to Cu—F. F reacts with oxygen or an OH group in moisture and converted into Cu oxide or Cu hydroxide. Corrosion of a copper wiring caused in this way poses a problem that it is difficult to obtain desired electrical characteristics.

Fluorine also remains on a via hole inner wall. Fluorine can become an etchant of an interlayer insulation film composed of, especially an inorganic insulation film with a low dielectric constant including $CH_3$ or H bonded to a $SiO_2$ framework. Accordingly, the interlayer insulation film is etched, so that an etching damage layer is formed. In particular, an interlayer insulation film which is porous due to lower dielectric constant of the interlayer insulation film is more vulnerable to damage. The etching damage layer poses a problem that the damage layer absorbs moisture and causes an increase in a dielectric constant when left in the atmosphere.

To suppress an adverse effect of moisture in the atmosphere and fluctuations in characteristics due to the effect as much as possible, an exposure time to the atmosphere after processing by dry etching using fluorine-based etching gas until the next process such as wet etching is strictly controlled. However, it can be hardly said that only controlling the exposure time to the atmosphere is sufficient since, in a case where production suspension occurs due to troubles such as power failure in a production line, only the control method is not sufficient to take proper measures.

SUMMARY

According to an aspect of the present invention, there is provided a manufacturing method for a semiconductor device, including: forming a metallic layer and an interlayer insulation film on a semiconductor substrate sequentially; etching on the interlayer insulation film using fluorine-based etching gas to form an opening portion of a predetermined pattern, reaching the metallic layer; and supplying chlorine-based silane gas and discharging, thus forming a Si film at least on an internal surface of the opening portion without exposure to the atmosphere after the etching.

DETAILED DESCRIPTION

Reference will now be made in detail to the present embodiment of the invention, an example of which is illustrated in the accompanying drawings. Wherever possible, the same reference numbers will be used throughout the drawings to refer to the same or like parts.

An embodiment according to the present invention will be described with reference to the accompanying drawings.

Figure 1:
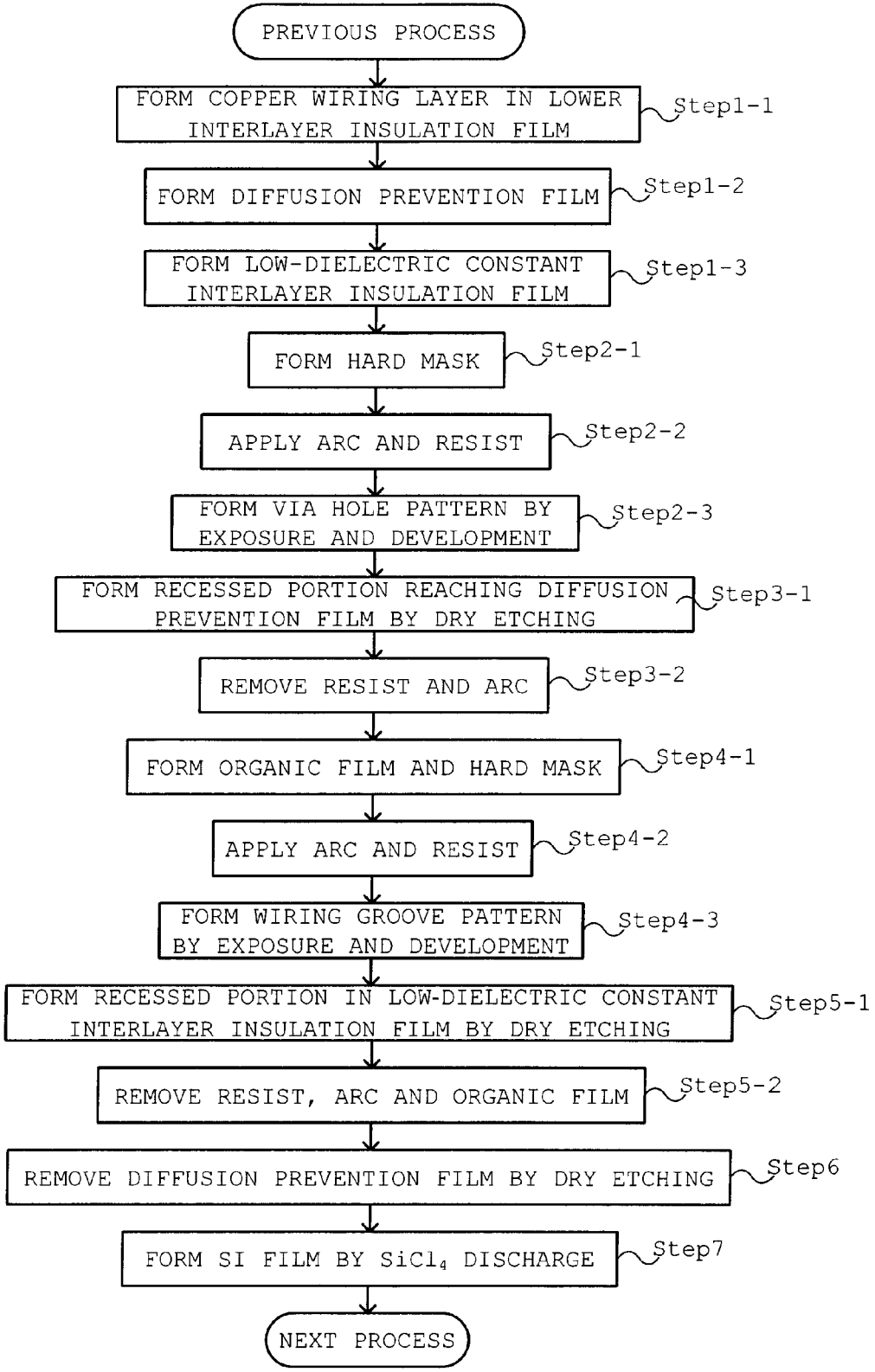
FIG. 1 is a flowchart of a process for manufacturing a semiconductor device according to an aspect of the present invention.

FIG. 1 is a flowchart of a process for manufacturing a semiconductor device according to the present embodiment. FIGS. 2 to 7 each illustrate a sectional view of a semiconductor substrate in a process for manufacturing a semiconductor device according to the present embodiment, respectively.

Figure 2:
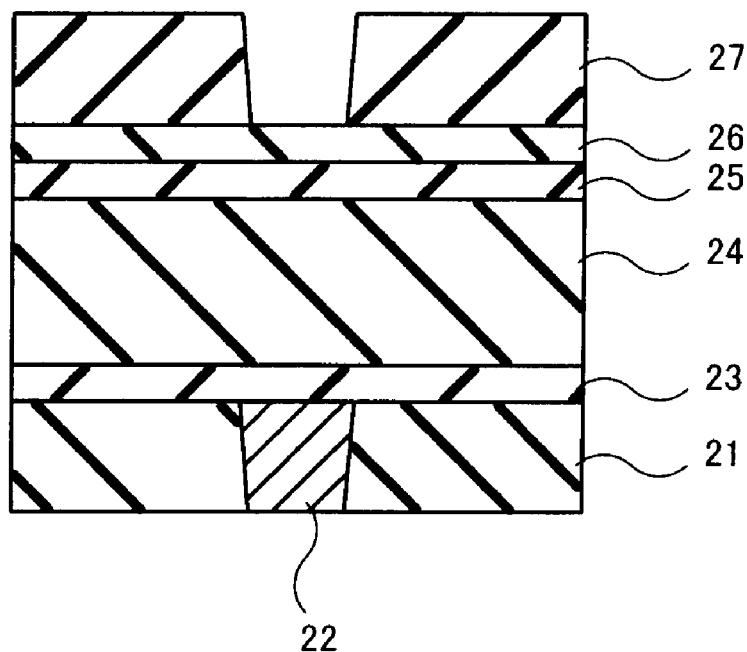
FIGS. 2 to 7 are views illustrating a process for manufacturing a semiconductor device according to an aspect of the present invention.

As illustrated in FIG. 2, a copper wiring layer 22 is formed as a lower metallic layer in an interlayer insulation film 21 formed on a semiconductor substrate (sub.) such as a Si substrate (Step 1-1). A SiCN film 23 of a few tens of nm is formed as an interlayer insulation film, which serves as a diffusion prevention film, using a chemical vapor deposition (CVD) apparatus (Step 1-2). A SiCOH film 24 of a few hundreds of nm having, for example, a relative permittivity of 2.6 is formed as a low dielectric constant interlayer insulation film also using a CVD apparatus (Step 1-3).

A $SiO_2$ film 25 of a few tens of nm is formed as a hard mask intended for vertical shaping also using a CVD apparatus (Step 2-1). An anti-reflection coating 26, hereinafter referred to as "ARC" and an ArF resist 27 adaptable to an ArF excimer laser (wavelength: 193 nm) are applied (Step 2-2). Then, exposure and development are performed by means of the lithography technology to form a via hole pattern (Step 2-3).

Figure 3:
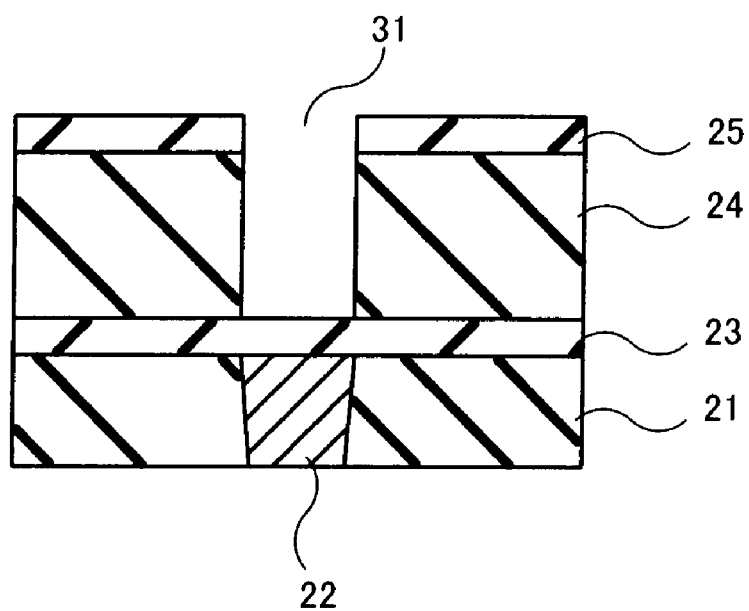

As illustrated in FIG. 3, with the ArF resist 27 having the via hole pattern used as a mask, a recessed portion 31 reaching the SiCN film 23 is formed by dry etching such as reactive ion etching (RIE) (Step 3-1). Then, the ArF resist 27 and the ARC 26, which are already unnecessary, are removed (Step 3-2).

Figure 4:
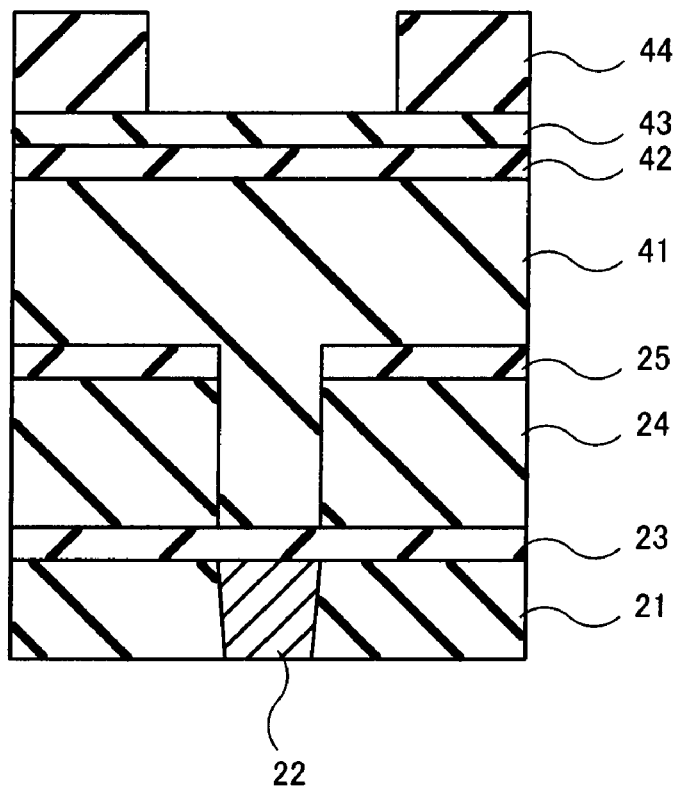

As illustrated in FIG. 4, an organic film 41 is applied such that a formed recessed portion 31 is filled and, using a CVD apparatus, a $SiO_2$ film 42 of a few tens of nm is formed as a hard mask (Step 4-1). An ARC 43 and an ArF resist 44 are applied in the same way (Step 4-2). Then, exposure and development are performed by means of the lithography technology to form a wiring groove pattern above the recessed portion 31 (Step 4-3).

Figure 5:
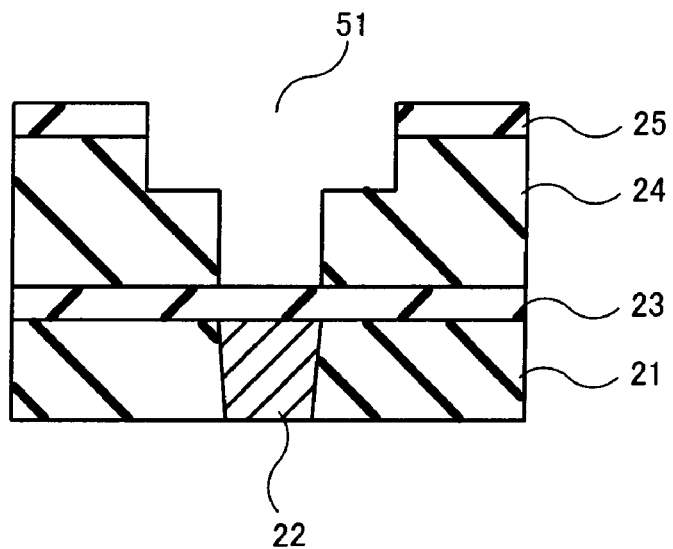

As illustrated in FIG. 5, with the ArF resist 44 having the wiring groove pattern used as a mask, a recessed portion 51 shallower than the recessed portion 31 is formed in the SiCOH film 24 by dry etching such as RIE (Step 5-1). Then, the ArF resist 44, the ARC 43 and the organic film 41, which are already unnecessary, are removed (Step 5-2).

Figure 6:
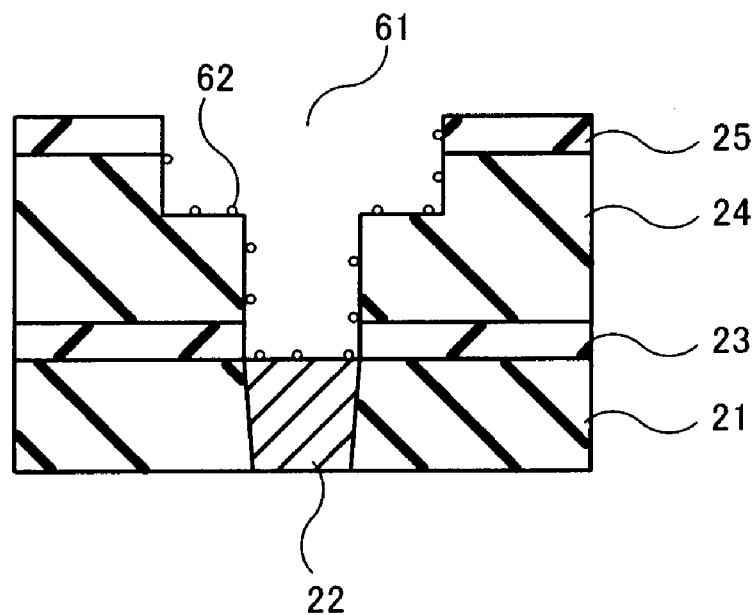

In a dry etching apparatus which performs plasma discharge, such as a RIE apparatus, a vacuum state of a pressure of approximately 10 mTorr is kept. As illustrated in FIG. 6, the SiCN film 23 exposed at the bottom portion of the recessed portion 31 is removed by dry etching, using etching gas including fluorine, such as $CF_4$, to form an opening portion 61 which serves as a dual damascene wiring groove (Step 6). At this time, fluorine 62 remains on an internal surface of the opening portion 61, that is, on surfaces of the exposed copper wiring layer 22 and the exposed SiCOH film 24.

Figure 7:
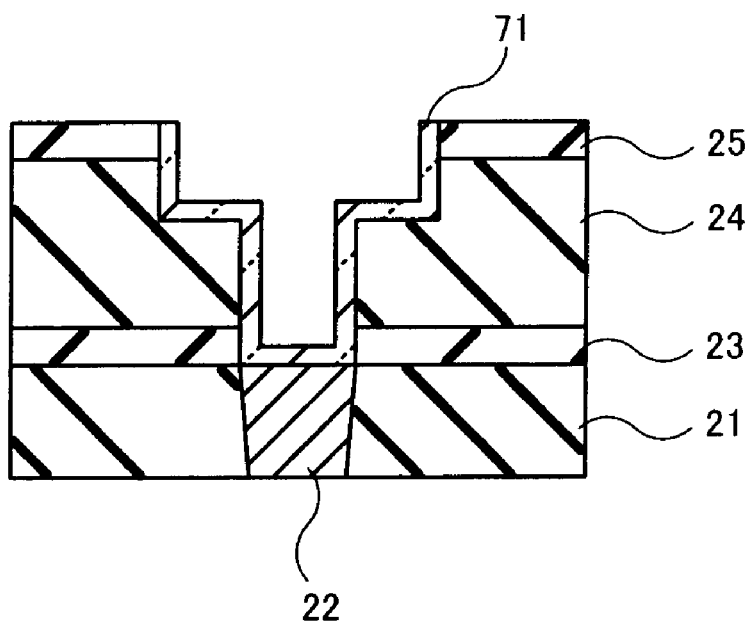

Then, as illustrated in FIG. 7, $SiCl_4$ is supplied as chlorine-based silane gas and plasma discharge is performed with a vacuum state maintained in the dry etching apparatus, that is, without exposing the Si substrate to the atmosphere, thus forming a Si film 71 of, for example, approximately 10 nm (Step 7). Processing conditions are, for example, pressure: 10 mTorr, power: 1,000 W, $SiCl_4$ flow rate: 50 sccm and substrate temperature: 30° C.

In this process, $SiCl_4$ is further dissociated into ions, radical and neutral molecules of Si and Cl molecules and the like. Cl is exhausted, almost unreacted without reacting with exposed $SiO_2$, SiCOH, SiCN or Cu. On the other hand, Si deposits on the exposed portion, so that the exposed portion is covered with the Si film 71.

Preferably, a film thickness of the Si film 71 is 5 to 20 nm. If the film thickness is less than 5 nm, variations in film formation or the like make it difficult to restrain an adverse effect of moisture in the atmosphere. On the other hand, if the film thickness is beyond 20 nm, it takes much time to perform removal in the next process, which may induce etching damage. More preferably, the film thickness is 5 to 10 nm.

In this process, the exposed portion is covered with the Si film in a state where a trace quantity of Cl remains; however, Cl is removed in peeling the Si film, which will be described later.

The exposed copper wiring layer and the SiCOH film are covered with the Si film in this way and therefore, even under the exposure to the atmosphere until the next process, the fluorine remaining on the surface of the copper wiring layer is inhibited from reacting with moisture in the atmosphere and corrosion of the copper wiring can be suppressed. Even if an etching damage layer is formed on the surface of the SiCOH film during dry etching, moisture absorption of the etching damage layer due to exposure to the atmosphere is suppressed and hence an increase in a dielectric constant of the SiCOH film can be suppressed.

Accordingly, after processing by dry etching using fluorine-based etching gas, an adverse effect of moisture in the atmosphere can be suppressed without need for strict control of exposure time to the atmosphere until the next process (for example, wet etching process). For example, even if production suspension occurs due to any troubles such as power failure in a production line, desired electrical characteristics can be maintained. Hence, quality degradation and yield degradation resulting therefrom can be inhibited.

A Si film formed in this way is peeled off before start of the next process (for example, wet etching process). In this process, a removal method is not particularly limited and, as long as a selectivity can be obtained for a metallic layer such as a copper wiring layer and an interlayer insulation film such as $SiO_2$, SiCOH or SiCN, dry etching such as RIE or chemical dry etching (CDE) or wet etching using nitrohydrofluoric acid or the like may be used.

In particular, when the next process is a wet etching process, preferably, a Si film is removed by wet etching from the viewpoint of efficiency. Use of the wet etching allows a metallic layer and an interlayer insulation film to be inhibited from being damaged and to take a sufficient selectivity relatively easily.

As a protective film against moisture in the atmosphere, a film other than a Si film may be used. However, a Si film is used for the following reason:

As described above, in removing the Si film, the Si film may take an etching selectivity for all of the lower metallic layer and the interlayer insulation films. Wet etching causing little film damage may be used and processing causing much surface damage, such as ashing required for an organic film or a carbon-based film, is not required. In removing the Si film by dry etching, fluorine is used and therefore minor surface damage may occur; however, the surface damage is not as much as that caused by ashing. Further, a film thickness of a Si film is approximately 5 to 10 nm and sufficiently functions as a protective film and therefore it is supposed that removing such a thin Si film only causes minor damage. Formation of a Si film is relatively easy and even if the Si film remains, the film will not becomes an impurity.

In the present embodiment, a SiCOH film with a relative permittivity of 2.6, which is an inorganic insulation film, is used as an interlayer insulation film. However, a SiOC film, a porous silica film or the like having a lower relative permittivity than a relative permittivity of 4.2 of $SiO_2$ may be used. In addition, a known organic film such as SiLK may be used. In particular, it is preferable that the relative permittivity is 2.6 or less from the viewpoint of inhibiting an electrical circuit signal delay.

For an interlayer insulation film having such a low dielectric constant, fluorine can become etchant and an etching damage layer is formed during etching. Hence, the interlayer insulation film is vulnerable to moisture in the atmosphere. Accordingly, it is effective to form a Si film.

In the present embodiment, a SiCN film is used as an interlayer insulation film, which serves as a diffusion prevention film. However, this is not limited to the SiCN film. Other films such as a SiC film or SiN film, having high barrier properties, may be used.

In the present embodiment, a copper wiring layer is used as a metallic layer formed as a lower layer. However, any metallic layer that is stable to chlorine-based silane gas used for formation of a Si film is applicable. For example, the present invention is also applicable to a case where a tungsten plug is formed on a lower layer.

In the present embodiment, a dual damascene wiring groove is formed as an opening portion. However, it is not limited to the dual damascene wiring groove. The present embodiment can also be applied to a case where a contact hole and a wiring groove are formed. At such an opening portion, a wiring layer such as Cu wiring layer is formed after the Si film is peeled off.

In the present embodiment, after an opening portion is formed at the interlayer insulation film by the dry etching apparatus, the supplied gas is changed from etching gas to film-forming gas to form a Si film in the same dry etching apparatus. In this way, film formation process of a Si film is performed with changed conditions in the same apparatus as for the etching process, so that a Si film can be formed with fluorine remaining on the surface without being exposed to the atmosphere.

In this process, a Si film is formed without using a film formation apparatus such as a CVD apparatus. The Si film formed by the dry etching apparatus is supposed to be a polysilicon film and film quality thereof is supposed to be inferior to that formed using a film formation apparatus. However, the film quality is supposed to be sufficient in forming a Si film as a protective film against moisture in the atmosphere.

The Si film does not always need to be formed in a dry etching apparatus. A Si film may be formed after the semiconductor substrate is moved into the film formation apparatus when the semiconductor substrate is movable from the dry etching apparatus to a film formation apparatus without being exposed to the atmosphere.

In the present embodiment, $CF_4$ is used as etching gas used to form the opening portion. However, in addition to $CF_4$, fluorine-based etching gas including CF-based gas such as $CHF_3$ or $CH_2F_2$ may be used. The etching gas may be used in combination with $O_2$, $N_2$ or Ar of dilution gas.

In the present embodiment, $SiCl_4$ is used as chlorine-based silane gas for formation of a Si film. However, in addition to $SiCl_4$, Si source gas including chlorine such as dichlorosilane or trichlorosilane may also be used.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing method for a semiconductor device, comprising:
    forming a metallic layer and an interlayer insulation film on a semiconductor substrate, sequentially;
    etching the interlayer insulation film using fluorine-based etching gas to form an opening portion of a predetermined pattern, the opening portion reaching the metallic layer;
    supplying chlorine-based silane gas and discharging to form a Si film at least on an internal surface of the opening portion without exposure to the atmosphere after the etching; and
    removing the Si film.

2. The manufacturing method for a semiconductor device according to claim 1, wherein the metallic layer is a copper wiring layer.

3. The manufacturing method for a semiconductor device according to claim 1, wherein the interlayer insulation film has a low-dielectric constant interlayer insulation film with a relative permittivity of less than 4.2.

4. The manufacturing method for a semiconductor device according to claim 3, wherein the interlayer insulation film has a low-dielectric constant interlayer insulation film with a relative permittivity of 2.6 or less.

5. The manufacturing method for a semiconductor device according to claim 3, wherein the interlayer insulation film includes at least any of a SiCOH film, a SiOC film, a porous silica film and an organic film.

6. The manufacturing method for a semiconductor device according to claim 1, wherein the interlayer insulation film includes at least any of a SiCN film, a SiC film and a SiN film.

7. The manufacturing method for a semiconductor device according to claim 1, wherein the fluorine-based etching gas includes at least anyone of $CF_4$, $CHF_3$ and $CH_2F_2$.

8. The manufacturing method for a semiconductor device according to claim 1, wherein the chlorine-based silane gas includes at least any of $SiCl_4$, dichlorosilane and trichlorosilane.

9. The manufacturing method for a semiconductor device according to claim 1, wherein a film thickness of the Si film is 5 to 20 nm.

10. The manufacturing method for a semiconductor device according to claim 9, wherein a film thickness of the Si film is 5 to 10 nm.

11. The manufacturing method for a semiconductor device according to claim 1, wherein
    the interlayer insulation film has a first interlayer insulation film formed on a metallic layer and a second interlayer insulation film formed on the first interlayer insulation film, and
    the etching includes a first etching process, a second etching process, and a third etching process, the first etching process is for etching the second interlayer insulation film to form a first recessed portion reaching the first interlayer insulation film, the second etching process is for etching a region including the first recessed portion of the second interlayer insulation film to form a second recessed portion being shallower than the first recessed portion, and the third etching process is for etching the first interlayer insulation film exposed on a bottom portion of the first recessed portion to be removed.

12. The manufacturing method for a semiconductor device according to claim 11, wherein the first interlayer insulation film includes at least any one of a SiCN film, a SiC film and a SiN film.

13. The manufacturing method for a semiconductor device according to claim 11, wherein the second interlayer insulation film includes at least anyone of a SiCOH film, a SiOC film, a porous silica film and an organic film.

14. The manufacturing method for a semiconductor device according to claim 11, wherein the opening portion is a dual damascene wiring groove.

15. The manufacturing method for a semiconductor device according to claim 1, wherein the opening portion is formed in a dry etching apparatus, the Si film is formed in the dry etching apparatus after the opening portion is formed without the semiconductor substrate unloaded from the dry etching apparatus.

16. The manufacturing method for a semiconductor device according to claim 1, wherein the Si film is removed by wet etching.

17. The manufacturing method for a semiconductor device according to claim 1, further comprising forming a wiring layer in the opening portion after the Si film is removed.

* * * * *